(12) United States Patent
Bae et al.

(10) Patent No.: US 7,250,655 B2
(45) Date of Patent: Jul. 31, 2007

(54) MOS TRANSISTOR HAVING A T-SHAPED GATE ELECTRODE

(75) Inventors: Geum-Jong Bae, Suwon (KR); Nae-In Lee, Seoul (KR); Hwa-Sung Rhee, Seoul (KR); Sang-Su Kim, Yongin-shi (KR); Jung-Il Lee, Gimcheon-shi (KR)

(73) Assignee: Samsung Electronics Co., Ltd., Suwon-city, Kyungki-do (KR)

( * ) Notice: Subject to any disclaimer, the term of this patent is extended or adjusted under 35 U.S.C. 154(b) by 230 days.

(21) Appl. No.: 10/659,384

(22) Filed: Sep. 11, 2003

(65) Prior Publication Data
US 2004/0115896 A1 Jun. 17, 2004

Related U.S. Application Data

(62) Division of application No. 10/274,035, filed on Oct. 21, 2002, now Pat. No. 6,716,689.

(30) Foreign Application Priority Data
Nov. 21, 2001 (KR) ................. 2001-72687

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. ............ 257/336; 257/337; 257/369
(58) Field of Classification Search ........ 257/336, 257/337, 338, 369, 388, 407
See application file for complete search history.

(56) References Cited

U.S. PATENT DOCUMENTS

| | | | |
|---|---|---|---|
| 5,272,100 A * | 12/1993 | Satoh et al. ............ 439/305 |
| 5,783,479 A | 7/1998 | Lin et al. | |
| 6,043,545 A | 3/2000 | Tseng et al. | |
| 6,316,297 B1 * | 11/2001 | Matsuda ............ 438/174 |
| 6,432,779 B1 * | 8/2002 | Hobbs et al. ............ 438/287 |
| 6,500,743 B1 * | 12/2002 | Lopatin et al. ............ 438/592 |
| 6,548,862 B2 * | 4/2003 | Ryu et al. ............ 257/331 |
| 6,891,235 B1 * | 5/2005 | Furukawa et al. ........ 257/408 |

OTHER PUBLICATIONS

Ghani, T., et al., "100 nm Gate Length High Performance..",IEDM Technical Digest, pp. 415-418 (1999).

* cited by examiner

*Primary Examiner*—Hoai Pham
(74) *Attorney, Agent, or Firm*—Lee & Morse, P.C.

(57) ABSTRACT

A MOS transistor having a T-shaped gate electrode and a method for fabricating the same are provided, wherein the MOS transistor includes a T-shaped gate electrode on a semiconductor substrate; an L-shaped lower spacer disposed at both sides of the gate electrode to cover a top surface of the semiconductor substrate; and low-, mid-, and high-concentration impurity regions formed in the semiconductor substrate of both sides of the gate electrode. The high-concentration impurity region is disposed in the semiconductor substrate next to the lower spacer and the mid-concentration impurity region is disposed between the high- and low-concentration impurity regions. A MOS transistor according to the present invention provides a decrease in a capacitance, a decrease in a channel length, and an increase in a cross-sectional area of the gate electrode. At the same time, the mid-concentration impurity region provides a decrease in a source/drain resistance $R_{sd}$.

17 Claims, 5 Drawing Sheets

Fig. 1

(Prior Art)

Fig. 2

(Prior Art)

MOS TRANSISTOR HAVING A T-SHAPED GATE ELECTRODE

This is a divisional of application Ser. No. 10/274,035 filed Oct. 21, 2002, now U.S. Pat. No. 6,716,689.

BACKGROUND OF THE INVENTION

1. Field of the Invention

The present invention relates to a semiconductor device and a method for fabricating the same. More particularly, the present invention relates to a metal-oxide-semiconductor (MOS) transistor having a T-shaped gate electrode and a method for fabricating the same.

2. Description of the Related Art

With developments in the electronics industry, high integration and high-speed characteristics are becoming increasingly important in semiconductor devices. To meet such requirements, MOS transistors with various structures have been used for the semiconductor devices. Semiconductor devices with conventional MOS transistors, however, cannot completely satisfy the requirements of the high integration and high-speed characteristics.

Figure 1:
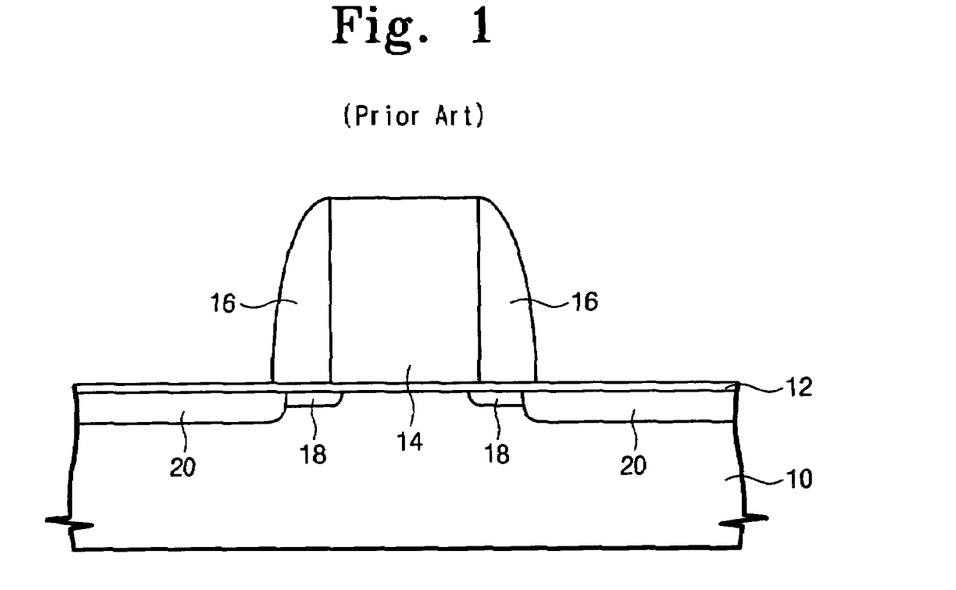
FIGS. 1 and 2 illustrate cross-sectional views for explaining conventional MOS transistors.

FIG. 1 illustrates a cross-sectional view of a conventional MOS transistor. Referring to FIG. 1, a gate oxide layer 12 and a gate pattern 14 are sequentially stacked on a semiconductor substrate 10. A gate spacer 16 is disposed on both sidewalls of the gate pattern 14. A high-concentration impurity region 20 is disposed in the semiconductor substrate next to the gate spacer 16.

As the gate pattern 14 has become gradually finer with the increased integration of the semiconductor device, a distance between the high-concentration impurity regions 20, i.e., a distance between source and drain regions, has been gradually reduced. This reduced distance results in a short channel effect that causes severe degradation of characteristics of the semiconductor devices.

Generally, to minimize such a short channel effect, a low-concentration impurity region 18 is formed in the semiconductor substrate 10 under the gate spacer 16, as shown in FIG. 1. A structure having high- and low-concentration impurity regions 20 and 18 is typically called a "lightly doped drain (LDD) structure."

However, even if the LDD structure minimizes the short channel effect caused by a shrinking of the width of the gate pattern 14, it is still difficult to shrink the width of the gate pattern 14 due to technical limitations. In addition, the fineness of the gate pattern 14 may cause problems other than the short channel effect, e.g., it may increase not only a resistance of a gate line, but also a capacitance between the gate pattern 14 and the high-concentration impurity region 20. Consequently, as the gate pattern 14 becomes gradually finer, it becomes more difficult to fabricate a high-speed semiconductor device.

Figure 2:
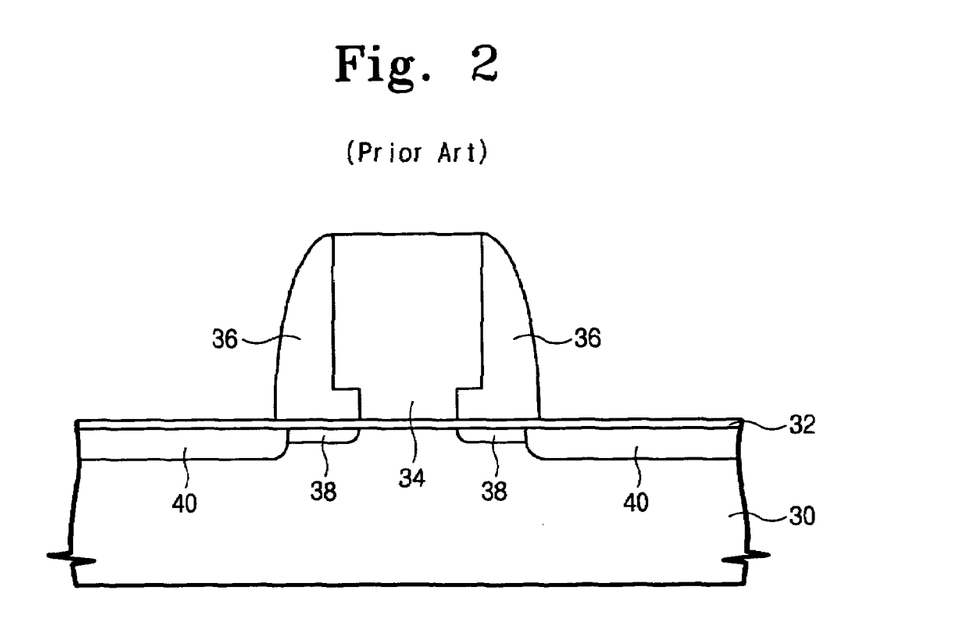

FIG. 2 illustrates a cross-sectional view of a recently proposed, conventional MOS transistor with T-shaped gate electrode.

Referring to FIG. 2, a gate oxide layer 32 and a gate pattern 34 are sequentially stacked on a semiconductor substrate 30. The gate pattern 34 is a T-shaped structure including an undercut region. A gate spacer 36 is disposed on both sidewalls of the gate pattern 34 to fill the undercut region. A high-concentration impurity region 40 is disposed in the semiconductor substrate 30 next to the gate spacer 36. A low-concentration impurity region 38 is disposed in the semiconductor substrate 30 under the gate spacer 36 and the undercut region.

In the MOS transistor having the gate pattern 34 as shown in FIG. 2, a distance between the high-concentration impurity region 40 and the gate pattern 34 is wider by as much as about a width of the undercut region, as compared with the MOS transistor of FIG. 1. Accordingly, a capacitance between the gate pattern 34 and the high-concentration impurity region 40 may be reduced. In addition, a channel width of the semiconductor device may be reduced by as much as the width of the undercut region.

Unfortunately, however, a width of the low-concentration impurity region 38 is increased by as much as the width of the undercut region. This results in a problem such as an increase in a source/drain resistance $R_{sd}$ of the transistor.

SUMMARY OF THE INVENTION

It is therefore a feature of the present invention to provide a method for fabricating a MOS transistor having a T-shaped gate electrode that can minimize a source/drain resistance.

It is another feature of the present invention to provide a MOS transistor including a mid-concentration impurity region that can minimize a source/drain resistance.

The present invention provides a method for fabricating a MOS transistor including forming a mid-concentration impurity region using an L-shaped spacer. A method of the present invention includes forming a T-shaped gate electrode on a semiconductor substrate, then forming a low-concentration impurity region in the semiconductor substrate on both sides of the gate electrode. An L-shaped lower spacer is disposed at both sides of the gate electrode to have a horizontal projection extended over the low-concentration impurity region. By using the L-shaped lower spacer and a gate pattern as an ion implantation mask, high- and mid-concentration impurity regions are formed.

Preferably, forming the T-shaped gate electrode includes forming lower and upper conductive layer patterns that are sequentially stacked on the semiconductor substrate, then selectively etching the lower conductive layer pattern such that an undercut region is formed under an edge of the upper conductive layer pattern. It is therefore preferable that the lower and upper conductive layer patterns are made of materials having an etch selectivity with respect to each other. For example, the lower conductive layer pattern is preferably made of silicon germanium or nitride titanium and the upper conductive layer pattern is made of polysilicon or tungsten. It is also preferable that the selective etching of the lower conductive layer pattern employs an isotropic etch process. Thus, an undercut region is formed under an edge of the upper conductive layer pattern.

Forming the L-shaped lower spacer includes sequentially conformally forming lower, intermediate, and upper insulating layers on an entire surface of the semiconductor substrate having the T-shaped gate electrode. The lower, intermediate, and upper insulating layers are successively etched to form L-shaped lower and intermediate spacers and an upper spacer. Thereafter, the upper and intermediate spacers are removed. In this case, the upper spacer is preferably formed by etching the upper insulating layer using an anisotropic etch process.

The lower spacer is preferably formed of a material selected from the group consisting of nitride, oxynitride, and polysilicon. The intermediate and upper spacers are preferably made of materials having etch selectivities with respect to the lower and intermediate spacers, respectively.

The present invention also provides a MOS transistor with a T-shaped gate electrode that includes an L-shaped spacer and a mid-concentration impurity region. The MOS transistor includes the T-shaped gate electrode; an L-shaped lower spacer; and low-, mid-, and high-concentration impurity regions. The T-shaped gate electrode is disposed on a semiconductor substrate. The L-shaped lower spacer is disposed at both sides of the gate electrode to cover the top surface of the semiconductor substrate. The low-, mid-, and high-concentration impurity regions are formed in the semiconductor substrate at both sides of the gate electrode. The high-concentration impurity region is disposed in the semiconductor substrate next to the lower spacer, and the mid-concentration impurity region is intervened between the high- and low-concentration impurity regions.

The gate electrode may be formed of lower and upper conductive layer patterns that are sequentially stacked. The upper conductive layer pattern is preferably wider than the lower conductive layer pattern so as to have an undercut region at a lower portion thereof. The lower spacer may further have a horizontal extension filling the undercut region.

The lower and upper conductive layer patterns are preferably made of materials having an etch selectivity with respect to each other. For instance, the lower conductive layer pattern is made of silicon germanium or nitride titanium and the upper conductive layer pattern is made of polysilicon or tungsten.

A surface insulating layer may be intervened between the gate electrode and the lower spacer.

BRIEF DESCRIPTION OF THE DRAWINGS

The above and other features and advantages of the present invention will become more apparent upon review of a detailed description of preferred embodiments thereof with reference to the attached drawings in which.

DETAILED DESCRIPTION OF THE INVENTION

Korean Patent Application No. 2001-72687, filed on Nov. 21, 2001, and entitled: "MOS Transistor Having T-Shaped Gate Electrode and Method for Fabricating the Same," is incorporated by reference herein in its entirety.

The present invention will now be described more fully hereinafter with reference to the accompanying drawings, in which preferred embodiments of the present invention are shown. The invention may, however, be embodied in different forms and should not be construed as limited to the embodiments set forth herein. Rather, these embodiments are provided so that this disclosure will be thorough and complete, and will fully convey the scope of the invention to those of ordinary skill in the art. In the attached figures, the thickness of layers and regions are exaggerated for clarity. It will also be understood that when a layer is referred to as being "on" another layer or substrate, it may be directly on the other layer or substrate, or intervening layers may also be present. Like reference numbers indicate like elements throughout the specification and drawings figures.

FIGS. 3 through 8 illustrate cross-sectional views for explaining the method for fabricating the MOS transistor in accordance to the preferred embodiment of the present invention.

Figure 3:
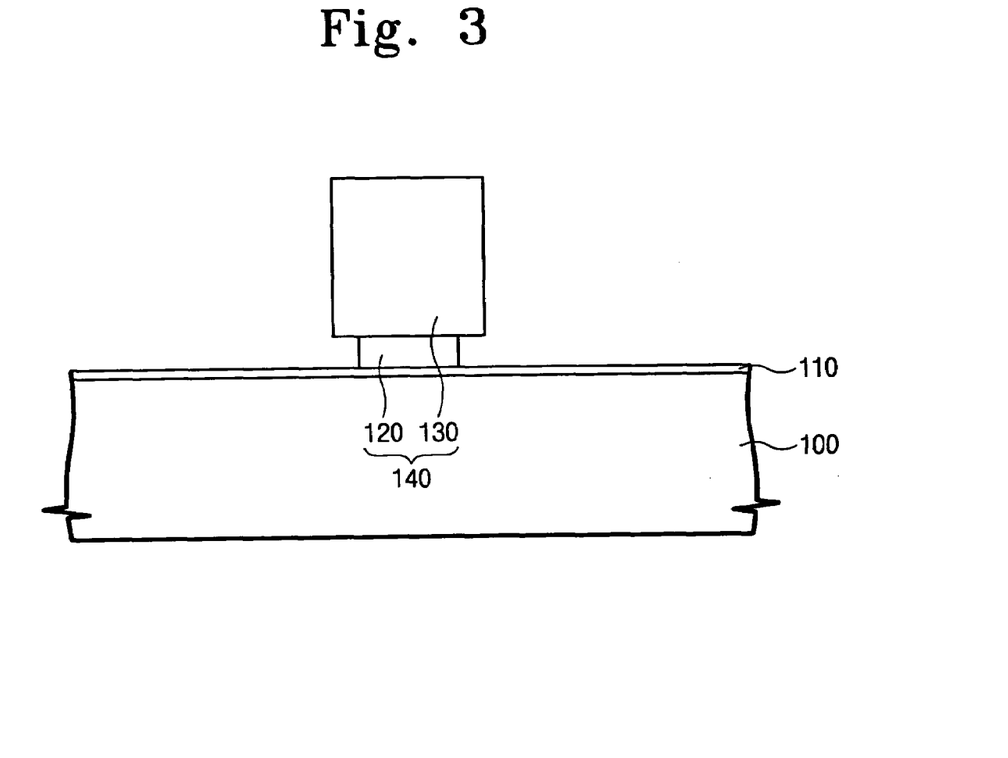
FIGS. 3 through 8 illustrate cross-sectional views for explaining a method for fabricating a MOS transistor having a T-shaped gate electrode in accordance with a preferred embodiment of the present invention.

Referring to FIG. 3, a device isolation layer pattern (not shown) is formed at a predetermined region of a semiconductor substrate 100 to define an active region. A gate oxide layer 110 is formed on the active region. A gate conductive layer is formed on an entire surface of the semiconductor substrate having the gate oxide layer 110. The gate conductive layer is then patterned until the gate oxide layer 110 is exposed such that a gate pattern 140 is formed across the active region. At this time, the gate pattern 140 is formed in the shape of T, i.e., having an undercut region.

It is preferable that the gate oxide layer 110 is formed by thermally oxidizing the exposed active region of the semiconductor substrate 100. The gate conductive layer is preferably formed of a lower conductive layer and an upper conductive layer that are sequentially stacked on an entire surface of the semiconductor substrate having the gate oxide layer 110. To form the gate pattern 140 having the undercut region, the upper and lower conductive layers are patterned to form a lower conductive layer pattern 120 and an upper conductive layer pattern 130 that are sequentially stacked, then selectively etching the lower conductive layer pattern 120. In this case, the selective etching for forming the undercut region preferably employs an isotropic etch process. In addition, another method for forming the undercut region includes forming the upper conductive layer pattern 130, then etching the lower conductive layer using an isotropic etch process. As a result, the undercut region, where sides of the lower conductive layer pattern 120 are etched, is formed under the upper conductive layer pattern 130. The upper and lower conductive layer patterns 130 and 120 constitute the gate pattern 140.

In the etching step for forming the gate pattern 140, the lower conductive layer pattern 120 and the gate oxide layer 110 are preferably made of materials having an etch selectivity with respect to each other in order to minimize etching damage to the semiconductor substrate 100. Likewise, in the selective etching for forming the undercut region, the lower conductive layer pattern 120 is preferably made of a material having etch selectivities with respect to the upper conductive layer pattern 130 and the gate oxide layer 110 to prevent etching damage.

Considering the etch selectivities between the material layers 110, 120, and 130, the lower and upper conductive layer patterns 120 and 130 are preferably made of silicon germanium and polysilicon, respectively. Alternatively, the lower and upper conductive layer patterns 120 and 130 may be preferably made of nitride titanium and tungsten, respectively.

Meanwhile, the gate pattern 140 may be a single layer made of one material other than the foregoing double layer of lower and upper conductive layer patterns 120 and 130. In this case, the gate pattern 140 is preferably a material layer having both conductivity and an etch selectivity with respect to the gate oxide layer 110. Therefore, the gate pattern 140 is preferably made of polysilicon.

To form the undercut region, the gate pattern 140 may be formed using a dry etching process having an etch selectivity with respect to the gate oxide layer 110. At this time, an etch gas of a plasma phase used for the dry etching process is irregularly reflected from the gate oxide layer 110 such that the undercut region is formed at the gate pattern 140.

Figure 4:
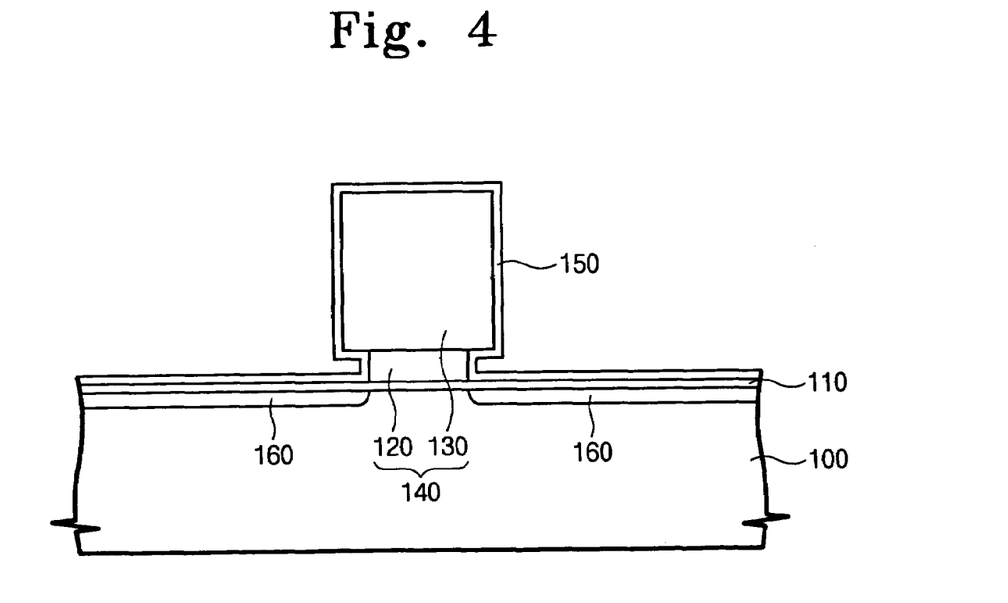

Referring to FIG. 4, a semiconductor substrate having the gate pattern 140 is thermally oxidized to cure any damage that occurred during the etching to form the gate pattern 140. Thus, a surface insulating layer 150 is conformally formed on an exposed surface of the gate pattern 140 where the undercut region is formed. The surface insulating layer 150 may also be formed on the exposed gate oxide layer 110 on both sides of the gate pattern 140.

Using the gate pattern 140 as an ion implantation mask, low-concentration impurity ions are implanted into the semiconductor substrate having the surface insulating layer 150. Thus, a low-concentration impurity region 160 is formed in the semiconductor substrate 100 on both sides of the gate pattern.

It is preferable that the low-concentration impurity region 160 is formed also under the undercut region. For this, the low-concentration impurity ions may be implanted into the semiconductor substrate 100 using an oblique ion implantation. In the low-concentration ion implantation process, the gate oxide layer 110 and the surface insulating layer 150 are used to prevent ion channeling.

Figure 5:
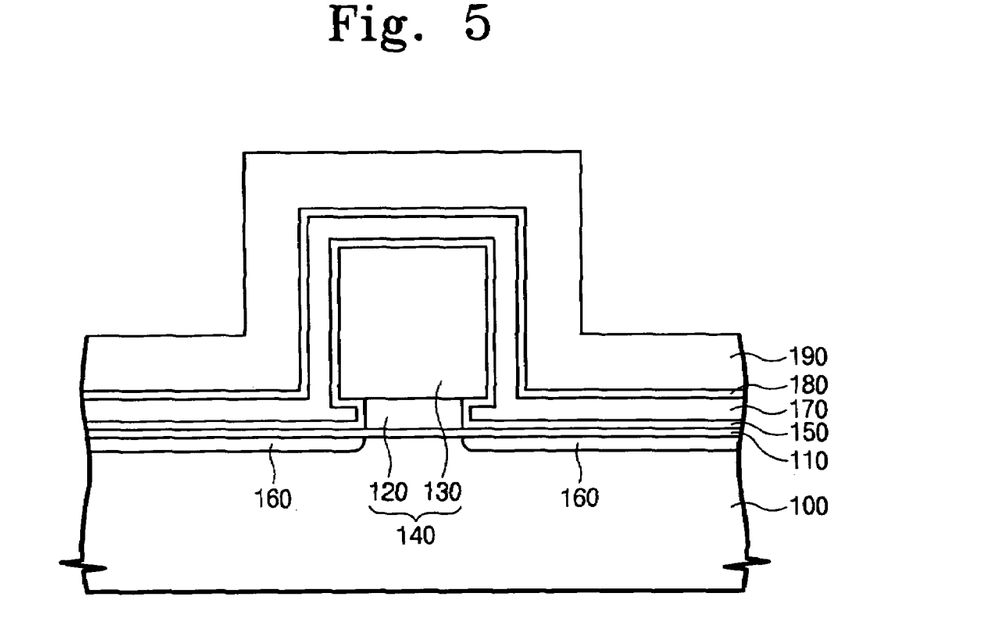

Referring to FIG. 5, a lower insulating layer 170, an intermediate insulating layer 180, and an upper insulating layer 190 that are sequentially stacked are conformally formed on an entire surface of the semiconductor substrate having the low-concentration impurity region 160.

Thus, the lower insulating layer 170 covers an entire surface of the surface insulating layer 150 and also fills the undercut region of the gate pattern 140. In case the undercut region is narrow, the surface insulating layer 150 alone may fill the undercut region.

At this time, the lower insulating layer 170 is preferably a material layer having an etch selectivity with respect to an oxide layer such as the gate oxide layer 110, the surface insulating layer 150, and the like. In addition, the intermediate insulating layer 180 is preferably a material layer having an etch selectivity with respect to the lower insulating layer 170. The upper insulating layer 190 is preferably a material layer having an etch selectivity with respect to the intermediate insulating layer 180. Preferably, the lower insulating layer 170 is formed of a material selected from the group consisting of nitride, oxynitride, and polysilicon. The intermediate insulating layer 180 and the upper insulating layer 190 are preferably an oxide layer and a nitride layer, respectively.

The intermediate insulating layer 180 is used to protect the lower insulating layer 170 during a subsequent step for removing the upper insulating layer 190. Therefore, in the event that the upper insulating layer 190 and the lower insulating layer 170 have an etch selectivity with respect to each other, the intermediate insulating layer 180 may be omitted.

Figure 6:
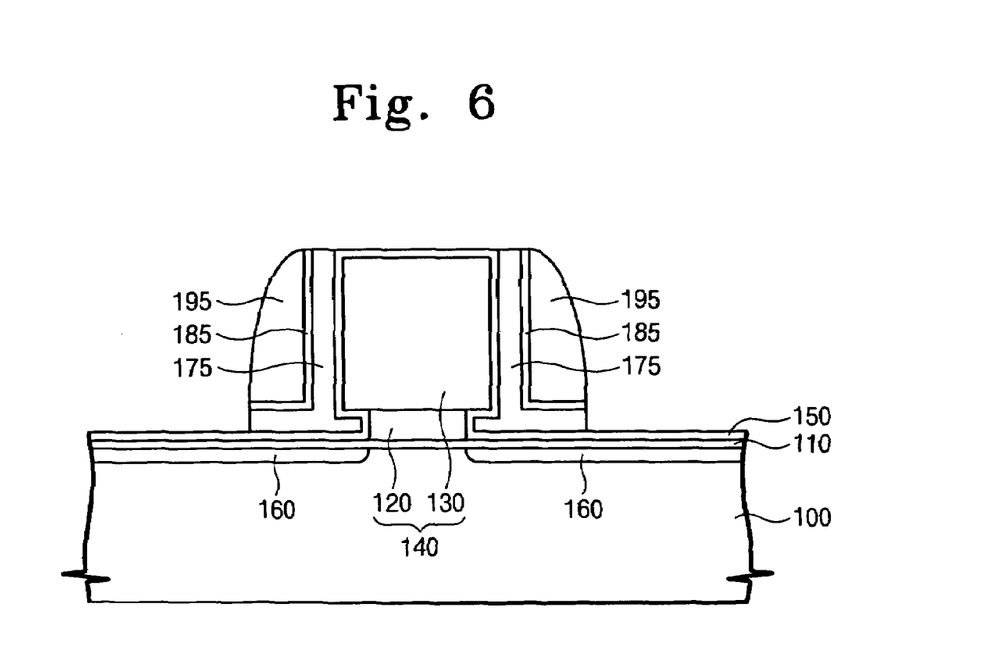

Referring to FIG. 6, the upper, intermediate, and lower insulating layers 190, 180, and 170 are successively etched using an anisotropic etch process until the surface insulating layer 150 is exposed. Thus, the upper insulating layer 190 forms an upper spacer 195 of a typical shape. By contrast, the intermediate and lower insulating layers 180 and 170 form L-shaped intermediate and lower spacers 185 and 175, respectively.

In this case, the L-shaped lower and intermediate spacers 175 and 185 have horizontal projections disposed under the upper spacer 195. That is, the intermediate spacer 185 is disposed on the horizontal projection of the lower spacer 175, and the upper spacer 195 is disposed on the horizontal projection of the intermediate spacer 185.

In the foregoing etching, the intermediate and lower spacers 185 and 175 may be formed using the isotropic etch process. The etching for forming the upper spacer 195, however, still employs the anisotropic etch process.

Figure 7:
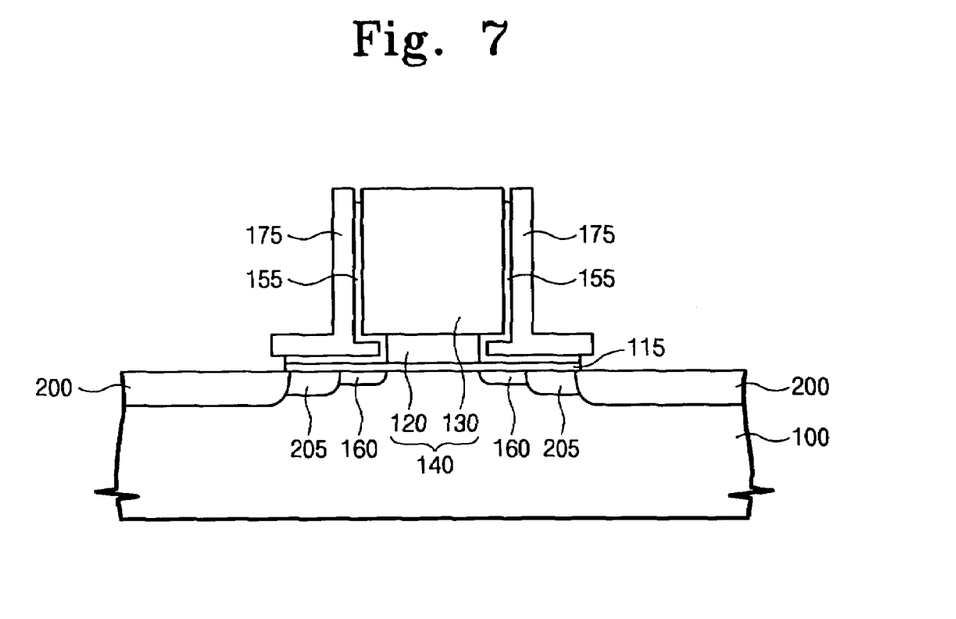

Referring to FIG. 7, the upper spacer 195 is removed using an etch recipe having etch selectivities with respect to the intermediate spacer 185 and the surface insulating layer 150. The intermediate spacer 185 is then removed using an etch recipe having etch selectivities with respect to the lower spacer 175 and the gate pattern 140.

The upper and intermediate spacers 195 and 185 are preferably removed using the isotropic etch processes. In the case where the intermediate spacer 185 is an oxide layer, the surface insulating layer 150 and the gate oxide layer 110, which are also oxide layers, may be etched together while the intermediate spacer 185 is removed. Accordingly, in the foregoing isotropic etch process, a surface insulating layer pattern 155 and a gate oxide layer pattern 115 are etched to form an undercut region under the lower spacer 175, as shown in FIG. 7. As a result, both a top surface of the gate pattern 140 and the semiconductor substrate 100 next to the lower spacer 175 are exposed. For the same reason, a top surface of the surface insulating layer pattern 155 is lower than the gate pattern 140.

Using the gate pattern 140 and the lower spacer 175 as an ion implantation mask, high-concentration impurity ions are implanted into the resultant structure where the intermediate spacer 185 is removed. Thus, a high-concentration impurity region 200 is formed in the semiconductor substrate 100 next to the lower spacer 175. At this time, the horizontal projection of the lower spacer 175 is used to reduce energies of the implanted ions during the high-concentration ion implantation. As a result, a mid-concentration impurity region 205 is formed under the horizontal projection of the lower spacer 175. The mid-concentration impurity region 205 has a lower concentration than the high-concentration impurity region 200.

Impurity concentration of the mid-concentration impurity region 205 is dependent upon a thickness of the horizontal projection of the lower spacer 175, i.e., a thickness of the lower insulating layer 170. Accordingly, a thickness of the lower insulating layer 170 is determined in consideration of the desired concentration of the mid-concentration impurity region 205.

In addition, a distance between the high-concentration impurity region 200 and the gate pattern 140 is dependent upon a length of the horizontal projection of the lower spacer 175. The length of the horizontal projection of the lower spacer 175 is dependent upon the thickness of the intermediate insulating layer 180 and the thickness of the upper insulating layer 190.

However, in the event that the upper and lower spacers 195 and 175 are made of the same material, a sidewall of the horizontal projection of the lower spacer 175 is etched together while the upper spacer 195 is removed using the isotropic etch process. Therefore, the thicknesses of the intermediate and upper insulating layers 180 and 190 are preferably determined in consideration of a desired length of the recessed horizontal projection of the lower spacer 175.

Figure 8:
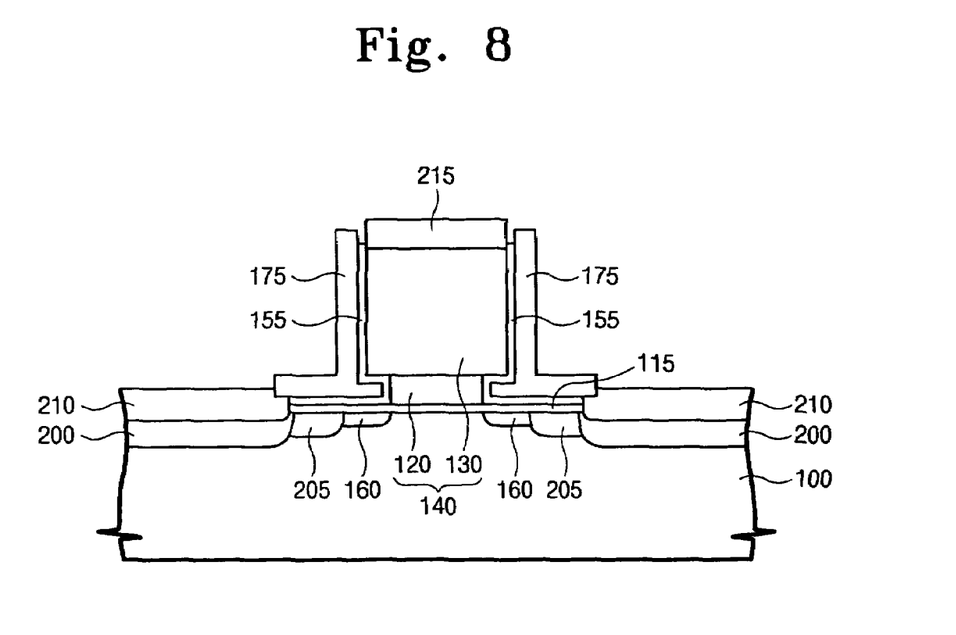

Referring to FIG. 8, a junction region silicide 210 and a gate silicide 215 are formed on the exposed high-concentration impurity region 200 and the gate pattern 140, respectively, according to a conventional method.

The junction region silicide 210 and the gate silicide 215 are preferably formed of a material selected from the group consisting of cobalt silicide, nickel silicide, and tungsten silicide. As mentioned above, since the top surface of the surface insulating layer pattern 155 is lower than the gate pattern 140, more of the gate pattern 140 is exposed during the silicidation process. Thus, more atoms of silicon react during the silicidation process. As a result, the gate silicide 215 can be stably formed without being cut due to fineness of the gate pattern 140.

Figure 9:
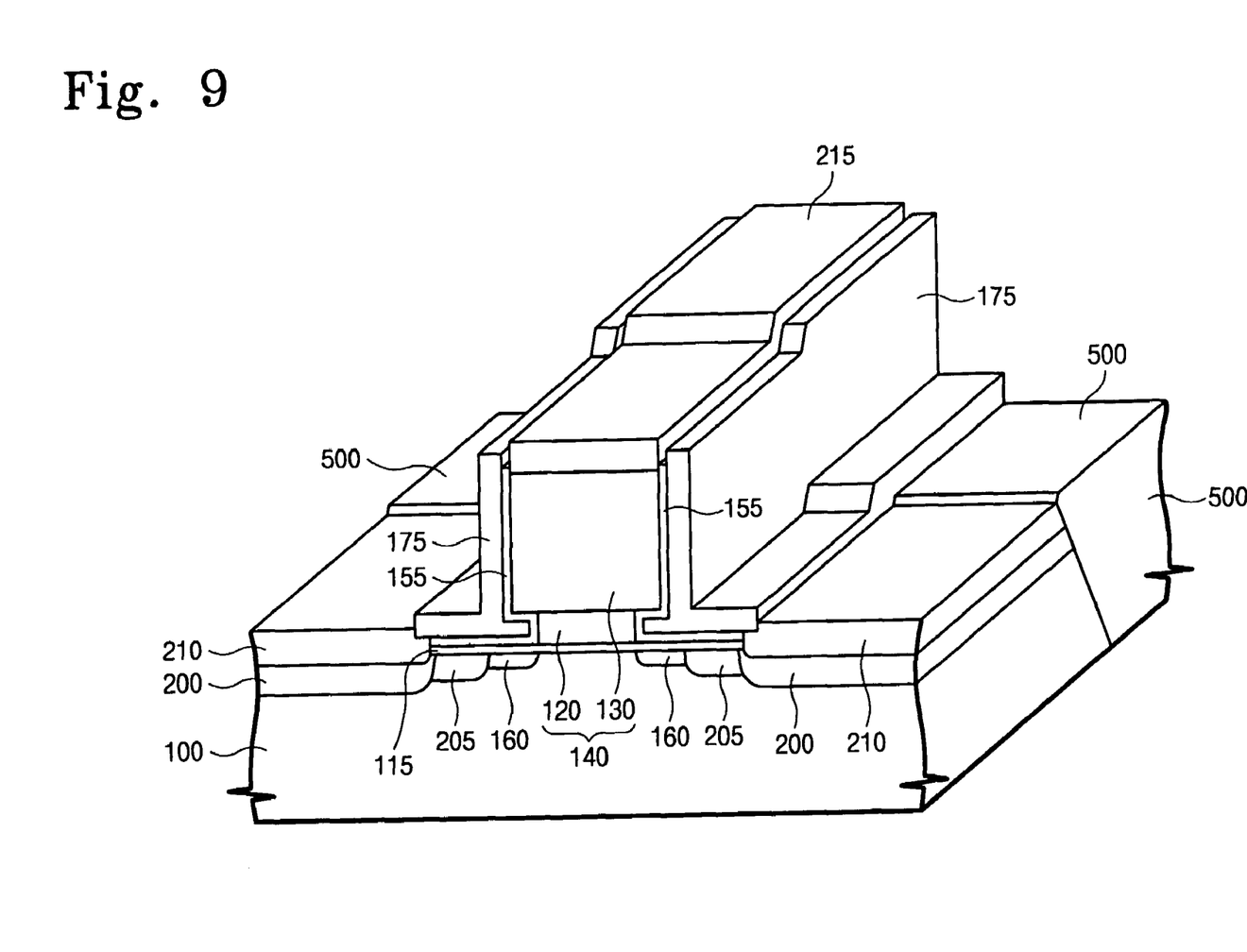
FIG. 9 illustrates a perspective view showing the MOS transistor having the T-shaped gate electrode in accordance with the preferred embodiment of the present invention.

FIG. 9 illustrates a perspective view for explaining the MOS transistor in accordance with a preferred embodiment of the present invention.

Referring to FIG. 9, a device isolation layer pattern 500 is disposed at a predetermined region of the semiconductor substrate 100 to define an active region. A gate oxide layer pattern 115 is disposed on a predetermined portion of the active region.

A T-shaped gate pattern 140 having the undercut region is disposed on the gate oxide layer pattern 115 across the device isolation layer pattern 500. A gate silicide 215 may be further disposed on the gate pattern 140.

A lower spacer 175 is disposed at both sides of the gate pattern 140 to have a horizontal projection extended over the gate oxide layer pattern 115. A surface insulating layer pattern 155 is intervened between the lower spacer 175 and the gate pattern 140 and also between the lower spacer 175 and the gate oxide layer pattern 115. In particular, the surface insulating layer pattern 155, together with the lower spacer 175, fills the undercut region of the gate pattern 140. For this, the lower spacer 175 may further have a horizontal extension extended to the undercut region.

A high-concentration impurity region 200 separated from the gate pattern 140 is disposed in a semiconductor substrate 100 next to the lower spacer 175. A junction region suicide 210 may be further disposed on the high-concentration impurity region 200.

A low-concentration impurity region 160 is disposed in the semiconductor substrate 100 under the undercut region of the gate pattern 140. Additionally, a mid-concentration impurity region 205 is disposed in the semiconductor substrate 100 under the horizontal projection of the lower spacer 175. That is, the mid-concentration impurity region 205 is intervened between the high- and low-concentration impurity regions 200 and 160.

According to the present invention, using the L-shaped spacer formed at both sides of the T-shaped gate electrode, a mid-concentration impurity region is formed between the high- and low-concentration impurity regions. As a result, it is possible to obtain advantages of the transistor with the T-shaped gate electrode, i.e., a decrease in a capacitance, a decrease in a channel length, and an increase in a cross-sectional area of the gate electrode. At the same time, it is also possible to obtain an advantage of the mid-concentration impurity region, i.e., a decrease in a source/drain resistance $R_{sd}$.

A preferred embodiment of the present invention has been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A MOS transistor, comprising:
    a T-shaped gate electrode on a semiconductor substrate, the T-shaped gate electrode having a wide portion and a narrow portion, the narrow portion between the wide portion and the semiconductor substrate, so as to have an undercut region adjacent to the narrow portion;
    an L-shaped lower spacer covering a top surface of the semiconductor substrate at both sides of the T-shaped gate electrode and covering sides of the wide portion of the T-shaped gate electrode, the L-shaped lower spacer having a first element substantially perpendicular to the semiconductor substrate, a second element, having substantially the same thickness as the first element, substantially parallel to the semiconductor substrate, the second element extending from the first element laterally away from the T-shaped gate electrode, and a third element substantially parallel to the semiconductor substrate extending from a bottom of the first element into the undercut region, wherein the first element and the second element intersect to define a substantially 90 degree angle in an outer surface of the L-shaped lower spacer;
    a low-concentration impurity region in the semiconductor substrate substantially under the first and third elements;
    a high-concentration impurity region in the semiconductor substrate next to the L-shaped lower spacer; and
    a mid-concentration impurity region between the high- and low-concentration impurity regions, substantially under the second element.

2. The MOS transistor as claimed in claim 1, wherein the T-shaped gate electrode comprises:
    lower and upper conductive layer patterns that are sequentially stacked, wherein the upper conductive layer pattern is wider than the lower conductive layer pattern to define the undercut region.

3. The MOS transistor as claimed in claim 2, wherein the lower and upper conductive layer patterns are made of materials having an etch selectivity with respect to each other.

4. The MOS transistor as claimed in claim 2, wherein the lower conductive layer pattern is made of silicon germanium or nitride titanium.

5. The MOS transistor as claimed in claim 2, wherein the upper conductive layer pattern is made of polysilicon or tungsten.

6. The MOS transistor as claimed in claim 1, wherein a width of the first element, which is measured beside the T-shaped gate electrode, is substantially equal to a thickness of the second element, which is measured on the mid-concentration impurity region.

7. The MOS transistor as claimed in claim 1, further comprising a surface insulating layer between the gate electrode and the L-shaped spacer.

8. The MOS transistor as claimed in claim 7, wherein the surface insulating layer partially, but not completely fills the undercut region and the third element of the L-shaped spacer completely fills the remainder of the undercut region.

9. The MOS transistor as claimed in claim 7, wherein the surface insulating layer is an insulating layer having an etch selectivity with the L-shaped spacer.

10. The MOS transistor as claimed in claim 9, wherein the surface insulating layer is a thermal oxide and the L-shaped spacer is at least one of nitride, oxynitride, and polysilicon.

11. A MOS transistor, comprising:
    a T-shaped gate electrode on a semiconductor substrate, the T-shaped gate electrode having a wide portion and a narrow portion, the narrow portion between the wide portion and the semiconductor substrate, so as to have an undercut region adjacent to the narrow portion;
    an L-shaped lower spacer covering a top surface of the semiconductor substrate at both sides of the T-shaped gate electrode and covering sides of the wide portion of the T-shaped gate electrode, the L-shaped lower spacer having a first element substantially perpendicular to the semiconductor substrate, a second element, having substantially the same thickness as the first element, substantially parallel to the semiconductor substrate, the second element extending from the first element laterally away from the T-shaped gate electrode, and a third element substantially parallel to the semiconductor substrate extending from a bottom of the first element into the undercut region, wherein the first element and the second element intersect to define a substantially 90 degree angle in an outer surface of the L-shaped lower spacer;

a low-concentration impurity region in the semiconductor substrate substantially under the first and third elements;

a high-concentration impurity region in the semiconductor substrate next to the L-shaped lower spacer;

a mid-concentration impurity region between the high- and low-concentration impurity regions, substantially under the second element, and a surface insulating layer intervened between the narrow portion of the gate electrode and the L-shaped lower spacer.

12. The MOS transistor as claimed in claim 11, wherein the surface insulating layer partially, but not completely, fills the undercut region and the L-shaped lower spacer completely fills the remainder of the undercut region.

13. The MOS transistor as claimed in claim 11, wherein a width of the first element, which is measured beside the T-shaped gate electrode, is substantially equal to a thickness of the second element, which is measured on the mid-concentration impurity region.

14. The MOS transistor as claimed in claim 11, wherein the surface insulating layer is an insulating layer having an etch selectivity with the L-spaced spacer.

15. The MOS transistor as claimed in claim 14, wherein the surface insulating layer is a thermal oxide and the L-shaped spacer is at least one of nitride, oxynitride, and polysilicon.

16. A MOS transistor comprising:

a T-shaped gate electrode on a semiconductor substrate, the T-shaped gate electrode having a narrow portion and a wide portion, which are stacked sequentially, to define an undercut region between the wide portion and the semiconductor substrate;

an L-shaped spacer locally at both sides of the T-shaped gate electrode, the L-shaped spaced having a first element substantially perpendicular to the semiconductor substrate, a second element extending away from a bottom of the first element, substantially parallel to the semiconductor substrate, and having substantially the same thickness as the first element, and a third element extending from the bottom of the first element, substantially parallel to the semiconductor substrate to partially fill the undercut region; and a surface insulating layer between the gate electrode and the L-shaped spacer to fill the remainder of the undercut region, wherein the surface insulating layer is an insulating layer having an etch selectivity with the L-spaced spacer.

17. The MOS transistor as claimed in claim 16, wherein the surface insulating layer is a thermal oxide and the L-shaped spacer is at least one of nitride, oxynitride, and polysilicon.

* * * * *